(12) United States Patent
Hsu

(10) Patent No.: US 7,033,733 B2
(45) Date of Patent: Apr. 25, 2006

(54) PHOTOSENSITIVE RESIN COMPOSITION FOR COLOR FILTERS

(75) Inventor: Po-Yi Hsu, Tainan (TW)

(73) Assignee: Chi Mei Corporation, Tainan (TW)

( * ) Notice: Subject to any disclaimer, the term of this patent is extended or adjusted under 35 U.S.C. 154(b) by 61 days.

(21) Appl. No.: 10/732,401

(22) Filed: Dec. 11, 2003

(65) Prior Publication Data

US 2004/0191671 A1    Sep. 30, 2004

(30) Foreign Application Priority Data

Mar. 31, 2003  (TW) .............................. 92107296 A

(51) Int. Cl.
*G03F 7/028* (2006.01)
*G03F 7/033* (2006.01)

(52) U.S. Cl. .................... 430/281.1; 430/7; 430/270.1; 430/286.1; 430/905; 430/910

(58) Field of Classification Search ............. 430/270.1, 430/7, 286.1, 281.1, 286.7, 905, 910
See application file for complete search history.

(56) References Cited

U.S. PATENT DOCUMENTS

2002/0119263 A1*  8/2002  Abe .......................... 428/1.3

OTHER PUBLICATIONS

Pearton et al. "GaN-based diodes and transistors for chemical, gas, biological and pressure sensing", J. Phys.:Condens. Matter, 16 (2004) R961-R994.*

* cited by examiner

*Primary Examiner*—Richard L. Schilling
(74) *Attorney, Agent, or Firm*—Rosenberg, Klein & Lee

(57) ABSTRACT

A photosensitive resin composition for color filters comprises (A) an alkali-soluble resin; (B) a photopolymerizable monomer; (C) a photoinitiator; (D) an organic solvent; and (E) a pigment; wherein said alkali-soluble resin (A) is formed by polymerizing at least one monomer (a-1), which dipole moment is below 1.5D and having at least one aromatic functional group and at least one copolymerizable monomer (a-2) other than said monomer (a-1), wherein the content of oligomer having a molecular weight below 1,000 of said alkali-soluble resin (A) is less than 0.6 wt %, based on the photosensitive resin composition except solvent(D), which remains less residue on an unexposed portion(s) of the substrate and the black matrix at the time of development, and provides color pixels having excellent heat resistance and chemical resistance, further provides LCD having lower electric resistance of the ITO electrode.

2 Claims, 2 Drawing Sheets

Table 1 Synthesis Examples of the alkali-soluble resin (A)

| Synthesis Examples | Components (parts by weight) ||||||||| Initiator | Solvent | Reaction Temp (°C) | Extracting by toluene ||
|---|---|---|---|---|---|---|---|---|---|---|---|---|---|
| | Monomers for Copolymerization |||||||| | | | | |
| | Compound (2) | Compound (6) | SM | THP | MAA | BzMA | MA | feed mode | AMBN | EEP | | parts by weight | time |
| a | 10 | | | | 15 | 75 | | one shot | 4 | 200 | 100 | 200 | 1 |
| b | 5 | | 5 | | 15 | 75 | | one shot | 4 | 200 | 100 | 400 | 1 |
| c | 5 | | | | 20 | 65 | 10 | one shot | 4 | 200 | 100 | 200 | 2 |
| d | | 15 | | | 15 | 70 | | one shot | 4 | 200 | 100 | 200 | 3 |
| e | | 5 | | | 10 | 65 | 20 | contionusly | 4 | 200 | 85 | 50 | 1 |
| f | | | | | 15 | 85 | | one shot | 4 | 200 | 100 | 0 | 0 |
| g | | | | | 15 | 65 | 20 | one shot | 4 | 200 | 100 | 0 | 0 |
| h | | | | 5 | 15 | 80 | | one shot | 4 | 200 | 100 | 50 | 1 |
| i | 10 | | | | 15 | 75 | | one shot | 4 | 200 | 100 | 0 | 0 |
| j | | 15 | | | 15 | 70 | | one shot | 4 | 200 | 100 | 0 | 0 |

Components                                  dipole moment(D)
Compound (2)   benzo furan                  0.57
Compound (6)   vinyl carbazole              0.81
SM             styrene monomer              0.02
THP            tetrahydropyrane             0.95
MAA            methacrylic acid             1.77
BzMA           benzyl methacrylate          1.84
MA             methyl acrylate              1.72
AMBN           2,2'-azobis-2-methyl butyronitrile    —
EEP            ethyl 3-ethoxypropionate     —

Table 2 Components and evaluation results of the photosensitive resin composition

| Components | | Examples | | | | | | | | Comparative Examples | | | | |
|---|---|---|---|---|---|---|---|---|---|---|---|---|---|---|
| | | 1 | 2 | 3 | 4 | 5 | 6 | 7 | | 1 | 2 | 3 | 4 | 5 |
| Alkali-soluble resin (A) (parts by weight) | a | 100 | | | | | | | | | | | | |
| | b | | 100 | | | | | | | | | | | |
| | c | | | 100 | | | | | | | | | | |
| | d | | | | 100 | | | | | | | | | |
| | e | | | | | 100 | | | | | | | | |
| | f | | | | | | 100 | | | | | | | |
| | g | | | | | | | 100 | | | | | | |
| | h | | | | | | | | | 100 | 100 | | | |
| | i | | | | | | | | | | | 100 | | |
| | j | | | | | | | | | | | | 100 | 100 |
| photopolymerizable monomer (B) (parts by weight) | B-1 | 120 | 120 | 120 | 120 | 120 | 120 | 120 | | 120 | 120 | 120 | 120 | 120 |
| photoinitiator (C) (parts by weight) | C-1 | 22 | 22 | 22 | 22 | 22 | 22 | 22 | | 22 | 22 | 22 | 22 | 22 |
| | C-2 | 22 | 22 | 22 | 22 | 22 | 22 | 22 | | 22 | 22 | 22 | 22 | 22 |
| | C-3 | 22 | 22 | 22 | 22 | 22 | 22 | 22 | | 22 | 22 | 22 | 22 | 22 |
| organic solvent (D) (parts by weight) | D-1 | 1000 | 1000 | 1000 | 1000 | 830 | 1000 | 830 | | 1000 | 1000 | 830 | 1000 | 1000 |
| | D-2 | | | | | 170 | | 170 | | | | 170 | | |
| pigment (E) (parts by weight) | E-1 | 130 | 130 | 130 | 130 | 130 | | | | 130 | 130 | 130 | 130 | 130 |
| | E-2 | | | | | | 130 | | | | | | | |
| | E-3 | | | | | | | 100 | | | | | | |
| content of oligomer having a molecular weight below 1,000 of the alkali-soluble resin (A)(wt%) | | 0.09 | 0.08 | 0.07 | 0.05 | 0.10 | 0.11 | 0.10 | | 0.01 | 0.08 | 0.25 | 0.80 | 0.95 |
| Results of Evaluation | Heat resistance | O | O | O | O | O | O | O | | × | Δ | Δ | Δ | Δ |
| | Chemical resistance | O | O | O | O | O | O | O | | × | × | Δ | O | O |
| | Residue | O | O | O | O | O | O | O | | Δ | × | Δ | O | O |
| | Electric resistance of ITO (Ω) | 20 | 19 | 20 | 21 | 21 | 19 | 19 | | 45 | 48 | 38 | 38 | 40 |

B-1 dipentaerythritol hexaacrylate
C-1 2-benzyl-2-N,N-dimethylamino-1-(4-morpholinophenyl)-1-butanone
C-2 4,4'-bis(diethylamino)benzophenone
C-3 2,2'-bis(2-chlorophenyl)-4,4',5,5'-tetraphenylbiimidazole
D-1 Ethyl 3-ethoxypropionate
D-2 propylene glycol methyl ether acetate
E-1 pigment C1254
E-2 pigment G36
E-3 pigment B15:6

PHOTOSENSITIVE RESIN COMPOSITION FOR COLOR FILTERS

BACKGROUND OF THE INVENTION

1. Field of the Invention

The present invention relates to a photosensitive resin composition for color filters. More specifically, it relates to a photosensitive resin composition, which makes it possible to produce a color filter having less residue on an unexposed portion(s) of the substrate and the black matrix at the time of development, and provides color pixels having excellent heat resistance and chemical resistance, and provides LCD having lower electric resistance of the ITO electrode and the like, particularly a color filter for use in color liquid crystal display devices.

2. Description of Related Art

Currently, the photolithographic process is widely applied to the manufacturing of liquid crystal display (LCD). In this process, the photosensitive resin composition is first coated on a substrate and pre-baked to evaporate the solvent so as to form a coating film. Then, the coating film is exposed to UV light through a photo mask, and developed with an alkaline developer solution to dissolve and remove unexposed portions of the coating film to form an array in a predetermined pattern. The substrate is then further heated, i.e., post-bake. In general, the red, green and blue (RGB) pixels or black matrix of the color filter or cured films, such as overcoats, interlayer insulating films can be formed by such techniques.

It's necessary that the cured films aforementioned are manufactured with the procedure of high temperature (above 220° C.) or strong base or strong acid. For example, the thermal processes include forming the ITO electrodes on the surface of the RGB pixels at 230° C., or annealing the ITO electrodes at 230~260 ° C. for lowering its electric resistance thereof. Therefore, how to increase the heat resistance and chemical resistance of the cured films is required.

In order to meet the above requirements, Japan Patent Publication No.1-52449 and No.9-311210 disclosed that the pixels of color filters could be manufactured by using a photosensitive resin composition comprising an alkali-soluble resin formed by copolymerization of methacrylic acid and esters of (meth)acrylate.

However, the ester functional group on the side chain of such copolymer is easily decomposed above 220° C., and the electric resistance of the ITO electrodes will be increased.

Additionally, the conventional method for producing the RGB pixels of the color filters is the dyeing process, in which the dyeing-possible resin such as natural gelatin or casein is patterned and dyed. Unfortunately, the heat resistance of these color pixels was still not satisfied by using the above process.

Recently, pigment-dispersing process is used to improve heat resistance of the cured film, and it can also provide an easier process for manufacturing the color filters.

However, it is necessary that the photosensitive resin composition is exposed and developed repeatedly during above pigment-dispersing process for color filters, and it is apt to produce a color filter having residue on an unexposed portion(s) of the substrate and the black matrix at the time of development. Therefore, further washing with a diluted developer solution or high-pressure water is required, which also complicates the manufacturing process of the color filters.

SUMMARY OF THE INVENTION

The object of the present invention is to provide a photosensitive resin composition for color filters, which remains less residue on an unexposed portion(s) of the substrate and the black matrix at the time of development, and provides color pixels having excellent heat resistance and chemical resistance, and provides LCD having lower electric resistance of the ITO electrode and the like, particularly a color filter for use in color liquid crystal display devices.

BRIEF DESCRIPTION OF THE TABLES

The preferred embodiments according to the present invention will be set forth in details thereinafter in illustration with the aid of the following tables, wherein:

Table 1 shows the synthesis examples of the alkali-soluble resin (A); and

Table 2 shows formulations and evaluation results in Examples 1–7 and Comparative Examples 1–5.

DETAILED DESCRIPTION OF THE INVENTION

The photosensitive resin composition for color filters comprises an alkali-soluble resin (A), a photopolymerizable monomer (B), a photoinitiator(C), an organic solvent (D) and a pigment (E), wherein said alkali-soluble resin (A) is formed by polymerizing at least one monomer (a-1) which dipole moment is below 1.5D and having at least one aromatic functional group and at least one copolymerizable monomer (a-2) other than said monomer (a-1), wherein the content of oligomer having a molecular weight below 1,000 of said alkali-soluble resin (A) is less than 0.6 wt %, based on the photosensitive resin composition except solvent(D).

Each component constituting the present invention will be described below.

(A) Alkali-Soluble Resin

The alkali-soluble resin, (A) in the present invention is formed with polymerizing at least one monomer (a-1) which dipole moment is below 1.5 D and having at least one aromatic functional group and at least one copolymerizable monomer (a-2) other than said monomer (a-1).

Examples of the monomer (a-1) are as follows:

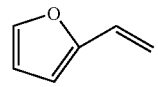

Compound (1)

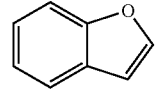

Compound (2)

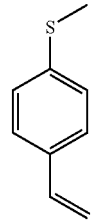

Compound (3)

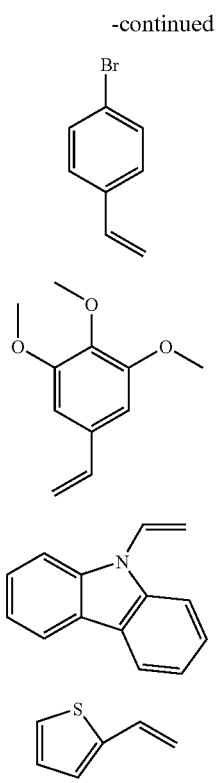

Compound (4)

Compound (5)

Compound (6)

Compound (7)

and styrene, α-methyl styrene, o-vinyl toluene, p-vinyl toluene, m-vinyl toluene and the like.

Among these, the compound (2), compound (6) and styrene aforementioned are preferred. The above monomers can be used along or in admixture of two or more.

The methods for measuring the dipole moment include dielectric constant method, molecular beam method and microwave spectroscopic analysis, etc. In the present invention, the dipole moment is measured by using the microwave spectroscopic analysis, and the analysis is based on the Stark effect of microwave absorption spectrum.

The copolymerizable monomer (a-2) other than said monomer (a-1) is not limited to a particular kind as long as it is copolymerizable with the monomer (a-1). Particularly, the copolymerizable monomer (a-2) preferably contains an ethylenically unsaturated monomer having at least one carboxyl group in the molecule (referred to as "carboxyl group-containing unsaturated monomer (a-2-1)" hereinafter) and other copolymerizable monomer other than monomer (a-2-1)(to be simply referred to as "other monomer (a-2—2)" hereinafter).

Examples of the carboxyl group-containing unsaturated monomer (a-2-1) are as follows: unsaturated monocarboxylic acids, such as acrylic acid, methacrylic acid, crotonic acid, chloroacrylic acid, ethacrylic acid and cinnamic acid etc.; unsaturated dicarboxylic acids (or its anhydrides), such as maleic acid, maleic anhydride, fumaric acid, itaconic acid, itaconic anhydride, citraconic acid and citraconic anhydride etc.; unsaturated polycarboxylic acids (or its anhydrides) having at least three carboxyl groups in the molecules and the like.

Among these, the acrylic acid and methacrylic acid are preferred. The carboxyl group-containing unsaturated monomer (a-2-1) can be used along or in admixture of two or more.

Examples of the other monomer (a-2—2) are as follows: unsaturated carboxylate, such as methyl acrylate, methyl methacrylate, ethyl acrylate, ethyl methacrylate, n-propyl acrylate, n-propyl methacrylate, iso-propyl acrylate, iso-propyl methacrylate, n-butyl acrylate, n-butyl methacrylate, iso-butyl acrylate, iso-butyl methacrylate, sec-butyl acrylate, sec-butyl methacrylate, tert-butyl acrylate, tert-butyl methacrylate, 2-hydroxyethyl acrylate, 2-hydroxyethyl methacrylate, 2-hydroxy propyl acrylate, 2-hydroxy propyl methacrylate, 3-hydroxy propyl acrylate, 3-hydroxy propyl methacrylate, 2-hydroxy butyl acrylate, 2-hydroxy butyl methacrylate, 3-hydroxy butyl acrylate, 3-hydroxy butyl methacrylate, 4-hydroxy butyl acrylate, 4-hydroxy butyl methacrylate, allyl acrylate, allyl methacrylate, benzyl acrylate, benzyl methacrylate, benzyl acrylate, phenyl methacrylate, methoxy triethylene glycol acrylate, methoxy triethylene glycol methacrylate, lauryl methacrylate, tertadecyl methacrylate, cetyl methacrylate, octadecyl methacrylate, eicosyl methacrylate and docosyl methacrylate etc.; unsaturated amino alkyl carboxylate, such as 2-aminoethyl acrylate, 2-aminoethyl methacrylate, 2-aminopropyl acrylate, 2-aminopropyl methacrylate, 3-aminopropyl acrylate and 3-aminopropyl methacrylate etc.; unsaturated glycidyl carboxylate, such as glycidyl acrylate, glycidyl methacrylate; vinyl carboxylate, such as vinyl acetate, vinyl propionate, vinyl butyrate and vinyl benzoic ester etc.; unsaturated ethers, such as vinyl methyl ether, vinyl ethyl ether, allyl glycidyl ether and methallyl glycidyl ether etc.; vinyl cyanide, such as acrylonitrile, methyl acrylonitrile, α-chloro acrylonitrile and vinylidene cyanide etc.; unsaturated amide, such as acrylamide, methacrylamide, α-chloroacrylamide, N-hydroxyethyl acrylamide and N-hydroxyethyl methacrylamide etc.; and aliphatic conjugate dienes, such as 1,3-butadiene, iso-propylene and chloropropylene etc.; and the like.

Among these, the methyl acrylate, methyl methacrylate, 2-hydroxyethyl acrylate, 2-hydroxyethyl methacrylate, benzyl acrylate, benzyl methacrylate are preferred. The other monomer (a-2—2) can be used along or in admixture of two or more.

In the present invention, the amount of the monomer (a-1) and (a-2) during the polymerization of the alkali-soluble resin (A) are based on 100 parts by weight of total said monomer (a-1) and (a-2).

The amount of monomer (a-1) is generally 1~35 parts by weight, preferably 2~30 parts by weight, more preferably 3~25 parts by weight.

The amount of monomer (a-2) is generally 99~65 parts by weight, preferably 98~70 parts by weight, more preferably 97~75 parts by weight.

As the copolymerizable monomer (a-2) contains monomer (a-2-1) and (a-2—2), the amount of monomer (a-2-1) is generally 2~40 parts by weight, preferably 5~35 parts by weight, more preferably 8~30 parts by weight, and the amount of monomer (a-2—2) is generally 25~97 parts by weight, preferably 40~93 parts by weight, more preferably 50~89 parts by weight.

Without the use of the monomers (a-1) during the polymerization of the alkali-soluble resin (A), the residue on an unexposed portion(s) of the substrate and the black matrix is increased, and it is apt to lower the heat and chemical resistance of the obtained color pixels, and the electric resistance of the ITO electrode is increased.

The content of oligomer of the alkali-soluble resin (A) is liable to increase when the dosage of the above monomer (a-1) is increased during polymerization of the alkali-soluble resin (A). Therefore, the amount of monomer (a-1) is preferably controlled as the above description.

The alkali-soluble resin (A) is formed by polymerization of at least one monomer (a-1) and at least one monomer (a-2).

Examples of the solvents used for the alkali-soluble resin (A) are as follows: (poly) alkylene glycol monoalkyl ether, such as ethylene glycol monomethyl ether, ethylene glycol monoethyl ether, diethylene glycol monomethyl ether, diethylene glycol monoethyl ether, diethylene glycol n-propyl ether, diethylene glycol n-butyl ether, triethylene glycol monomethyl ether, triethylene glycol monoethyl ether, propylene glycol monomethyl ether, propylene glycol monoethyl ether, dipropylene glycol monomethyl ether, dipropylene glycol monoethyl ether, dipropylene glycol n-propyl ether, dipropylene glycol n-butyl ether, tripropylene glycol monomethyl ether, tripropylene glycol monoethyl ether; (poly) alkylene glycol monoalkyl ether acetate, such as ethylene glycol monomethyl ether acetate, ethylene glycol monoethyl ether acetate, propylene glycol monomethyl ether acetate, propylene glycol monoethyl ether acetate and the like; ether, such as diethylene glycol dimethyl ether, diethylene glycol methyl ethyl ether, diethylene glycol diethyl ether, tetrahydrofuran; ketone, such as methyl ethyl ketone, cyclohexanone, 2-heptanone, 3-heptanone; alkyl lactate, such as methyl 2-hydroxypropionate and ethyl 2-hydroxypropionate; other esters, such as methyl 2-hydroxy-2-methylpropionate, ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxy acetate, ethyl hydroxy acetate, methyl 2-hydroxy-3-methylbutyrate, 3-methoxy butyl acetate, 3-ethoxybutyl acetate, 3-methyl-3-methoxybutyl acetate, 3-methyl-3-methoxybutyl propionate, ethyl acetate, n-propyl acetate, i-propyl acetate, n-butyl acetate, i-butyl acetate, n-amyl acetate, i-amyl acetate, n-butyl propionate, ethyl butyrate, n-propyl butyrate, i-propyl butyrate, n-butyl butyrate, methyl pyruvic acid ester, ethyl pyruvic acid ester, n-propyl pyruvic acid ester, methyl acetoacetate, ethyl acetoacetate and ethyl-2-oxobutyrate; aromatic hydrocarbons, such as toluene and xylene; carboxylic acid amides, such as N-methylpyrrolidone, N,N-dimethylformamide, N,N-dimethylacetoamide and the like.

The solvents can be used along or in admixture of two or more.

Among these solvents, the Propylene glycol monomethyl ether acetate and ethyl 3-ethoxy propionate are preferred.

Examples of the initiators used for preparing the alkali-soluble resin (A) are free radical polymerization initiators can be exemplified as follows: azo compounds, such as 2,2'-azobisisobutyro nitrile, 2,2'-azobis-(2,4-dimethylvaleronitrile), 2,2'-azobis-(4-methoxy-2,4-dimethylvaleronitrile), 2,2'-azobis-2-methyl butyronitrile, and the like; peroxide, such as benzoyl peroxide and the like.

The alkali-soluble resins (A) in the present invention have a weight average molecular weight measured by gel permeation chromatography with a polystyrene standard (GPC: tetrahydrofuran as an elution solvent) of 3,000 to 50,000, preferably 4,000 to 40,000, more preferably 4,500 to 35,000. By using the alkali-soluble resin having such specified weight average molecular weight, a photosensitive resin composition having excellent developability can be obtained and color pixels having a sharp pattern edge can be formed.

(B) Photopolymerizable Monomer

The amount of photopolymerizable monomer (B) used in the present invention is generally 5~220 parts by weight, preferably 50~160 parts by weight, based on 100 parts by weight of the alkali-soluble resin (A).

The photopolymerizable monomer (B) in the present invention is a monomer having at least one ethylenically unsaturated double bond. Examples of the photopolymerizable monomer (B) having one ethylenically unsaturated double bond are as follows: acrylamide, (meth)acryloylmorpholine, 7-amino-3,7-dimethyloctyl (meth)acrylate, isobutoxymethyl (meth)acrylamide, isobornyloxyethyl (meth)acrylate, isobornyl (meth)acrylate, 2-ethylhexyl (meth)acrylate, ethyl diethylene glycol (meth)acrylate, t-octyl (meth)acrylamide, diacetone (meth)acrylamide, dimethylaminoethyl (meth)acrylate, dodecyl (meth)acrylate, dicyclopentenyloxyethyl (meth)acrylate, dicyclopentenyl (meth)acrylate, N,N-dimethyl (meth)acrylamide, tetrachlorophenyl (meth)acrylate, 2-tetrachlorophenoxyethyl (meth)acrylate, tetrahydrofurfuryl (meth)acrylate, tetrabromophenyl (meth)acrylate, 2-tetrabromophenoxyethyl (meth)acrylate, 2-trichlorophenoxyethyl (meth)acrylate, tribromophenyl (meth)acrylate, 2-tribromophenoxyethyl (meth)acrylate, 2-hydroxyethyl (meth)acrylate, 2-hydroxypropyl (meth)acrylate, vinylcaprolactam, N-vinylpyrrolidinone, phenoxyethyl (meth)acrylate, pentachlorophenyl (meth)acrylate, pentabromophenyl (meth)acrylate, polyethylene glycol mono(meth)acrylate, polypropylene glycol mono(meth)acrylate and bornyl (meth)acrylate, and the like.

Example of the photopolymerizable monomer (B) having two or more ethylenically unsaturated double bond are as follows: ethylene glycol di(meth)acrylate, dicyclopentenyl di(meth)acrylate, triethylene glycol diacrylate, tetraethylene glycol di(meth)acrylate, tris(2-hydroxyethyl) isocyanate di(meth)acrylate, tris(2-hydroxyethyl) isocyanante tri(meth) acrylate, caprolactone-modified tris(2-hydroxyethyl) isocyanante tri(meth)acrylate, trimethylolpropyl tri(meth)acrylate, ethyleneoxide (hereinafter abbreviated as EO) modified trimethylolpropyl tri(meth)acrylate, propyleneoxide (hereinafter abbreviated as PO) modified trimethylolpropyl tri (meth)acrylate, tripropylene glycol di(meth)acrylate, neopentyl glycol di(meth)acrylte, 1,4-butanediol di(meth) acrylate, 1,6-hexadiol di(meth)acrylate, pentaerythritol tri (meth)acrylate, pentaerythritol tetra(meth)acrylate, polyester di(meth)acrylate, polyethylene glycol di(meth) acrylate, dipentaerythritol hexa(meth)acrylate, dipentaerythritol penta(meth)acrylate, dipentaerythritol tetra(meth)acrylate, caprolactone-modified dipentaerythritol hexa(meth) acrylate, caprolactone-modified dipentaerythritol penta (meth)acrylate, ditrimethylolpropyl tetra(meth)acrylate, EO-modified bisphenol A di(meth)acrylate, PO-modified bisphenol A di(meth)acrylate, EO-modified hydrogenated bisphenol A di(meth)acrylate, PO-modified hydrogenated bisphenol A di(meth)acrylate, PO modified glycerol triacrylate, EO modified bisphenol F di(meth)acrylate, phenol novolac polyglycidyl ether (meth)acrylate, and the like.

Among these, trimethylolpropyl triacrylate, EO-modified trimethylolpropyl triacrylate, PO-modified trimethylolpropyl triacrylate, pentaerythritol triacrylate, pentaerythritol tetraacrylate, dipentaerythritol hexaacrylate, dipentaerythritol pentaacrylate, dipentaerythritol tetaacrylate, caprolactone-modified dipentaerythritol hexaacrylate, ditrimethylolpropyl tetraacrylate and PO modified glycerol triacrylate are preferred.

(C) Photoinitiator

The amount of the photoinitiator (C) used in the present invention is generally 20~120 parts by weight, preferably 30~100 parts by weight, based on 100 parts by weight of the photopolymerizable monomer (B).

The photoinitiator (C) aforementioned can be selected from acetophenone or biimidazole.

Examples of the acetophenone series compounds include p-dimethylaminoacetophenone, α,α'-dimethoxyazoxyacetophenone, 2,2'-dimethyl-2-phenylacetophenone, p-methoxy-acetophenone, 2-methyl-[4-(methylthio)phenol, 2-morpholino-1-propanone, 2-benzyl-2-N,N-dimethylamino-1-(4-morpholinophenyl)-1-butanone.

Examples of the biimidazole series compounds include 2,2'-bis(o-chlorophenyl)-4,4',5,5'-tetraphenylbiimidazole, 2,2'-bis(o-fluorophenyl)-4,4',5,5'-tetraphenylbiimidazole, 2,2'-bis(o-methylphenyl)-4,4',5,5'-tetraphenylbiimidazole 2,2'-bis(o-methoxyphenyl)-4,4',5,5'-tetraphenylbiimidazole, 2,2'-bis(p-methoxyphenyl)-4,4',5,5'-tetraphenylbiimidazole, 2,2'-bis(2,2',4,4'-tetramethoxyphenyl)-4,4'5,5'-tetraphenylbiimidazole, 2,2'-bis(2-chlorophenyl)-4,4'5,5'-tetraphenylbiimidazole, 2,2'-bis(2,4-dichlorophenyl)-4,4'5,5'-tetraphenylbiimidazole and the like. Among these, a combined photoinitiator of 2-benzyl-2-N,N-dimethylamino-1-(4-morpholinophenyl)-1-butanone and 2,2'-bis(2-chlorophenyl)-4,4'5,5'-tetraphenylbiimidazole is preferred.

In the photosensitive resin composition for color filters of the present invention, the photoinitiators of the benzophenone series compounds can be further added, such as thioxanthone, 2,4-diethylthioxanthone, thioxanthone-4-sulfone, benzophenone, 4,4'-bis(dimethylamino)benzophenone, 4,4'-bis(diethylamino)benzophenone and the like.

Examples of the other photoinitiators that can be further added in the present invention include α-diketone series compounds, such as benzil, acetyl and the like; acyloin series compounds, such as benzoin and the like; acyloin ether series compounds, such as benzoin methyl ether, benzoin ethyl ether, benzoin isopropyl ether and the like; acylphosphineoxide series compounds, such as 2,4,6-trimethylbenzoyl diphenylphosphineoxide, bis-(2,6-dimethoxybenzoyl)-2,4,4-trimethyl benzylphosphineoxide and the like; quinone series compounds, such as anthraquinone, 1,4-naphthoquinone and the like; halide compounds, such as phenacyl chloride, tribromomethyl phenylsulfone, tris(trichloromethyl)-s-triazine and the like; peroxide, such as di-tert-butyl peroxide and the like. Among these, benzophenone series compounds, such as 4,4'-bis(diethylamino) benzophenone is preferred.

(D) Organic Solvent

The photosensitive composition for color filters of the present invention comprises the above alkali-soluble resin (A), the above photopolymerizable monomer (B), the above photoinitiator (C) and the below pigment (E) as essential components and may optionally contain the below additive components as required. All the above components except the pigment (E) are generally dissolved in an appropriate solvent to prepare a liquid composition. Any solvents, which are inert to the other components and have appropriate volatility can be selectively used as long as they can disperse or dissolve one of the following components, that is, the alkali-soluble resin (A), the photopolymerizable monomer (B), photoinitiator (C), the pigment (E) and the additive components.

The amount of the organic solvent (D) used for preparing the photosensitive resin composition for color filters in the present invention is generally 300~2,500 parts by weight, preferably 500~2,000 parts by weight, based on 100 parts by weight of said alkali-soluble resin (A).

Examples of the solvent (D) are the same as the aforementioned descriptions of the solvents for polymerization of the alkali-soluble resin (A). Among these solvents, the Propylene glycol monomethyl ether acetate and ethyl 3-ethoxy propionate are preferred. The solvents can be used along or in admixture of two or more.

(E) Pigment

The amount of pigment (E) used for preparing the photosensitive resin composition for color filters in the present invention is generally 20~500 parts by weight, preferably 50~400 parts by weight, based on 100 parts by weight of the alkali-soluble resin (A).

The pigment (E) in the present invention may be either inorganic or organic pigment.

The inorganic pigment is a metallic compound, such as metallic oxide, metallic complex and the like, such as the oxides or complex oxides of iron, cobalt, aluminum, cadmium, lead, copper, titanium, magnesium, chromium, zinc, antimony and the like.

Examples of the organic pigments are as follows:

C.I. Pigment Yellow 1, 3, 11, 12, 13, 14, 15, 16, 17, 20, 24, 31, 53, 55, 60, 61, 65, 71, 73, 74, 81, 83, 93, 95, 97, 98, 99, 100, 101, 104, 106, 108, 109, 110, 113, 114, 116, 117, 119, 120, 126, 127, 128, 129, 138, 139, 150, 151, 152, 153, 154, 155, 156, 166, 167, 168, 175.

C.I. Pigment Orange 1, 5, 13, 14, 16, 17, 24, 34, 36, 38, 40, 43, 46, 49, 51, 61, 63, 64, 71, 73.

C.I. Pigment Red 1, 2, 3, 4, 5, 6, 7, 8, 9, 10, 11, 12, 14, 15, 16, 17, 18, 19, 21, 22, 23, 30, 31, 32, 37, 38, 40, 41, 42, 48:1, 48:2, 48:3, 48:4, 49:1, 49:2, 50:1, 52:1, 53:1, 57, 57:1, 57:2, 58:2, 58:4, 60:1, 63:1, 63:2, 64:1, 81:1, 83, 88, 90:1, 97, 101, 102, 104, 105, 106, 108, 112, 113, 114, 122, 123, 144, 146, 149, 150, 151, 155, 166, 168, 170, 171, 172, 174, 175, 176, 177, 178, 179, 180, 185, 187,188, 190, 193,194, 202, 206, 207, 208, 209, 215, 216, 220, 224, 226, 242, 243, 245, 254, 255, 264, 265.

C.I. Pigment Violet 1, 19, 23, 29, 32, 36,38, 39.

C.I. PigmentBlue 1, 2, 15, 15:3, 15:4, 15:6, 16, 22, 60, 66.

C.I. Pigment Green 7, 36, 37.

C.I. Pigment Brown 23, 25, 28.

C.I. Pigment Black 1, 7.

The pigments aforementioned can be used along or in admixture of two or more.

The pigment (E) in the present invention can be used in combination with a dispersant as desired.

The dispersant is, for example, a cationic, anionic, nonionic or amphoteric surfactant, or a silicone-based or fluorine-based surfactant in terms of composition.

Examples of the surfactant include polyoxyethylene alkyl ethers, such as polyoxyethylene lauryl ether, polyoxyethylene stearyl ether, polyoxyethylene oleyl ether, and the like; polyoxyethylene aryl ethers, such as polyoxyethylene octyl phenyl ether, polyoxyehtylene nonyl phenyl ether; polyethylene glycol dialkyl esters, such as polyethylene glycol dilaurate, polyethylene glycol distearate, and the like; sorbitan fatty acid esters; fatty acid modified polyesters; tertiary amine modified polyurethans. The following examples can be used as such a surfactants: organosiloxane polymer, KP341 (manufactured by Shin-Etsu Chemical Industry Co., Ltd.), (meth)acrylic acid polymer, Polyflow No. 75, No. 90, No. 95 (manufactured by Kyoei-Sha Yushi Kagaku Kogyo Co., Ltd.), Megafac F171, F172, F173 (manufactured by Dainippon Chemicals and Ink Co., Ltd.), Florard FC430, FC431 (manufactured by Sumitomo 3M Co., Ltd.), and Asahi Gard G710, Serflon S382, SC-101, SC-102, SC-103, SC-104, SC-105, SC-1068 (manufactured by Asahi Glass Co., Ltd.), and the like. The surfactants can be used alone or in admixture of two or more.

To improve coatability of the present invention, the photosensitive resin composition can be used in combination with a surfactant. The amount of the surfactants used in the present invention is generally 0~6 parts by weight, preferably 0~3 parts by weight, based on 100 parts by weight of said alkali-soluble resin (A). Examples of the surfactants are the same as the surfactants used in the pigment aforementioned.

The photosensitive composition of the present invention can contain other additives, such as fillers, polymers other than the alkali-soluble resin (A) according to the present invention, adhesion agents, antioxidants, UV absorbents, anti-coagulants and the like. The amount of the additives used in the present invention is generally 0~10 parts by weight, preferably 0~6 parts by weight, more preferably 0~3 parts by weight, based on 100 parts by weight of said alkali-soluble resin (A).

Examples of these additives can be exemplified as follows: fillers, such as glass, alumina; polymers other than the alkali-soluble resin (A), such as polyvinyl alcohol, polyacrylic acid, polyethylene glycol monoalkyl ether, polyfluoro alkylacrylate and the like; adhesion agents, such as vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxy-silane, 3-aminopropyltriethoxysilane, 3-glycidyloxypropyltrimethoxysilane, 3-glycidyloxypropylmethyldimethoxysilane, 2-(3,4-epoxycyclohexyl)ethyltrimethoxy-silane, 3-chloropropylmethyldimethoxysilane, 3-chloropropyltrimethoxysilane, 3-methacryloxypropyltrimethoxysilane, 3-mercaptopropyltrimethoxysilane and the like; antioxidants, such as 2,2-thiobis(4-methyl-6-t-butylphenol), 2,6-di-t-butylphenol and the like; UV absorbents, such as 2-(3-t-butyl-5-methyl-2-hydroxyphenyl)-5-chlorobenzotriazole, alkoxybenzophenone and the like; and anti-coagulant, such as sodium polyacrylate.

The photosensitive resin composition for color filters according to the present invention is formed by blending the above-mentioned components (A)–(E) in a mixer to obtain a solution, and the additives such as surfactant or adhesion agent can be added, optionally.

In the present invention, the content of oligomer having a molecular weight below 1,000 of said alkali-soluble resin (A) is less than 0.6 wt %, preferably less than 0.5 wt %, more preferably less than 0.4 wt %, based on the photosensitive resin composition except solvent (D).

In the present invention, the oligomer of the alkali-soluble resin (A) is that it contains at least two monomer units come from monomer (a-1) and/or monomer (a-2), such as units of (a-1)/(a-1), (a-1)/(a-2), (a-2)/(a-2), (a-1)/(a-2)/(a-2) etc., as long as it has a molecular weight below 1000 measured by gel permeation chromatography with the polystyrene standard.

When the content of oligomer having a molecular weight below 1,000 of the alkali-soluble resin (A) is more than 0.6 wt %, the heat resistance of the obtained color pixels is low, and the electric resistance of the ITO electrode increases.

The content of oligomer having a molecular weight below 1,000 of the alkali-soluble resin (A) can be controlled according to the species and amount of the initiator, chain-transfer agent and monomers, feed modes, such as continuous charge or one shot charge of monomers and initiators, reaction temperature and reaction time of polymerization of the alkali-soluble resin (A), and poor-solvent treatment of the alkali-soluble resin (A).

Then, the photosensitive resin composition for color filters is coated on the substrate and pre-baked to evaporate the solvent so as to form a coating film. Examples of coating process include spin coating, slit spin coating, slit coating and rolling coating.

The pre-bake conditions is depended on the kinds and dosages of each component of the photosensitive resin composition, which temperature is on a range from 70° C. to 90° C. with residence time of from 1 minute to 15 minutes. Then, a coating film is formed on the substrate. Thereafter, the coating film is exposed to UV light through a photo mask and developed with an alkali developer solution at 23° C.±2° C. for about 30 seconds to 5 minutes to dissolve and remove the un-exposed portions of the coating film, so as to give a desired pattern. The UV light used for this purpose can be g line, h line and I line and the like. The UV lamp is (ultra) high pressure mercury lamp and metal halide lamp.

The substrate used to form the color filter is made from bare glass, soda glass, pyres glass, silica glass, and these glass coated with a transparent conductive film, or transparent electrode substrate used in solid state image pick up device. A black matrix is formed on the substrate to separate each color pixel element.

The alkali developer is preferably an aqueous solution of sodium hydroxide, potassium hydroxide, sodium carbonate, sodium hydrogencarbonate, potassium carbonate, potassium hydrogencarbonate, sodium silicate, sodium methylsilicate, aqueous ammonia, ethylamine, diethylamine, dimethyl ethanolamine, tetramethylammonium hydroxide, tetraethylammonium hydroxide, choline, pyrrole, piperidine, 1,8-diazabicyclo (5,4,0) -7-undecene and the like. The concentration of alkali developer is 0.001 wt %~10 wt %, preferably 0.01 wt %~1 wt %.

After developed with the developer solution, the resulted pattern is sufficiently washed with water and dried with compressed air or compressed nitrogen.

Finally, it is post-baked with a heating device such as a hot plate at 150° C.~250° C. for 5~60 minutes or an oven at 150° C.~250° C. for 30~90 minutes By repeating the above procedures for photosensitive resin composition comprising red and green and blue pigment dispersed therein, a color filter having arrays of red, green and blue pixels arranged on the substrate is obtained.

Moreover, the ITO electrode film can be formed on the color pixels with sputtering procedure at 220° C.~250° C., and it can be etched and patterned, if necessary. Then, polyimide polymer is coated on the ITO electrode film to form an alignment layer, and the color filter of LCD is obtained.

EXAMPLES AND COMPARATIVE EXAMPLES

The present invention will be further illustrated by the following examples.

[Synthesis of the Alkali-Soluble Resin (A)]

Synthesis Example a

A 1000 ml four-necked conical flask equipped with a stirrer, a heater, a condenser, and a thermometer is purged with nitrogen. Then a mixture of monomers comprising 10 parts by weight of compound (2), 15 parts by weight of methacrylic acid monomer (hereinafter abbreviated as MAA), 75 parts by weight of benzyl methacrylate monomer (hereinafter abbreviated as BzMA) and 200 parts by weight of ethyl 3-ethoxy propionate (hereinafter abbreviated as EEP) as the solvent, which was shown in Table 1, was charged to the flask. The monomer mixture was charged in one shot. The mixture in the conical flask was stirred and the temperature of the oil bath was raised to 100° C.

Then 4 parts by weight of 2,2'-azobis-2-methylbutyronitrile (hereinafter abbreviated as AMBN) shown in Table 1 was dissolved in EEP solvent to form an initiator solution. The initiator solution was divided into 5 divisions and charged into the four-necked conical flask, respectively. The interval between two charges (divisions) of the initiator solution was 1 hr. The temperature of the polymerization was maintained at 100° C., and the time of polymerization was 6 hours.

After polymerization, the polymer solution was stirred with 200 parts by weight of toluene (poor solvent) for extraction. Then, the alkali-soluble resin (a) could be obtained.

Synthesis Example b

The procedure of Synthesis Example a was repeated, except that the kinds and dosages of the monomers were changed, and the amount of toluene was 400 parts by weight in extraction stage. The formulation and reaction conditions were shown in Table 1.

Synthesis Example c

The procedure of Synthesis Example a was repeated, except that the kinds and dosages of the monomers were changed, and the procedures for extraction were carried out twice after polymerization. The formulation and reaction conditions were shown in Table 1.

Synthesis Example d

The procedure of Synthesis Example a was repeated, except that the kinds and dosages of the monomers were changed, and the procedures for extraction were carried out three times after polymerization. The formulation and reaction conditions were shown in Table 1.

Synthesis Example e

A 1000 ml four-necked conical flask equipped with a stirrer, a heater, a condenser, and a thermometer was purged with nitrogen. 200 parts by weight of EEP as the solvent was charged to the flask. It was stirred and the temperature of the oil bath was raised to 85° C.

Then, a mixture of monomers comprising 3 parts by weight of compound (6), 6 parts by weight of MAA monomer, 45 parts by weight of BzMA monomer and 12 parts by weight of methyl acrylate (hereinafter abbreviated as MA) monomer was charged to the flask. The mixture of the monomers was charged continuously within a period of one hour after the temperature of the oil bath is raised to 85° C.

In addition, a mixture of monomers comprising 2 parts by weight of compound (6), 4 parts by weight of MAA monomer, 20 parts by weight of BzMA monomer and 8 parts by weight of MA monomer was charged to the flask. The mixture of the monomers was charged continuously within a period of five hours after the temperature of the oil bath was raised to 85° C.

After the temperature of the oil bath was raised to 85° C., 4 parts by weight of the initiator AMBN was dissolved in the organic solvent EEP to form an initiator solution. It was divided into 5 divisions and charged into the four-necked conical flask, respectively. The interval between two charges (divisions) of the AMBN solution was one hour.

The temperature of polymerization was maintained at 85° C., and the time of polymerization was 6 hours.

After polymerization, the polymer solution was stirred with 50 parts by weight of toluene (poor solvent) for extraction. Then, the alkali-soluble resin (e) could be obtained.

Synthesis Examples f~g

The procedure of the Synthesis Example a was repeated, except that the kinds and dosages of the monomers were changed, and procedures for extraction were not proceeded after polymerization. The formulation and reaction conditions were shown in Table 1.

Synthesis Example h

The procedure of Synthesis Example a was repeated, except that the kinds and dosages of the monomers were changed, and the amount of toluene was 50 parts by weight for extraction. The formulation and reaction conditions were shown in Table 1.

Synthesis Example I

The procedure of Synthesis Example a was repeated, except that the procedures for extraction were not proceeded after polymerization. The formulation and reaction conditions were shown in Table 1.

Synthesis Example j

The procedure of Synthesis Example d was repeated, except that the procedures for extraction were not proceeded after polymerization. The formulation and reaction conditions were shown in Table 1.

[Preparation of the Photosensitive Resin Composition]

Example 1

100 parts by weight (based on dry matter) of the alkali-soluble resin (a) obtained in the above Synthesis Example a, 120 parts by weight of dipentaerythritol hexaacrylate (hereinafter abbreviated as B-1), 22 parts by weight of 2-benzyl-2-N,N-dimethylamino-1-(4-morpholinophenyl)-1-butanone (hereinafter abbreviated as C-1), 22 parts by weight of 4,4'-bis(diethylamino)benzophenone (hereinafter abbreviated as C-2), 22 parts by weight of 2,2'-bis(2-chlorophenyl)-4,4',5,5'-tetraphenylbiimidazole (hereinafter abbreviated as C-3) and 130 parts by weight of pigment CI 254 (hereinafter abbreviated as E-1) were mixed and dissolved/dispersed in 1,000 parts by weight of ethyl 3-ethoxypropionate (hereinafter abbreviated as D-1) to prepare a liquid photosensitive resin composition for color filters. The photosensitive resin composition was evaluated with the following analysis, and the results were listed in Table 2.

Examples 2–7 and Comparative Examples 1–5

The procedure of Example 1 is repeated, except that the kinds and dosages of the alkali-soluble resin (A), the solvent (D) and the pigment (E) were changed. The formulation and evaluation results were shown in Table 2.

Evaluation Mode

1. Content of Oligomer (Unit: wt %)

The photosensitive resin composition was dissolved in acetone and then the solution was analyzed with gas chromatograph equipped with flame ionization detector (Hewlett Packard Company, series No 6890A).

The content of oligomer can be calculated by following equation.

The content of oligomer having a molecular weight below 1,000 of the alkali-soluble (A)/The weight of the photosensitive resin composition except solvent (D)×100 wt %

2. Heat Resistance

The photosensitive resin composition was coated onto the surface of a glass substrate with a spin coater to form a 8 μm wet film, and pre-baked at 85° C. for 5 minutes. Thereafter, the substrate was exposed to 200 mJ/cm² of ultraviolet light (exposure machine is manufactured from Canon Company, the series No is PLA-501F). The substrate was then immersed in a developer solution at 23° C. for 2 minutes, and it was then washed with pure water and dried with air. Thereafter, it was post-baked at 200° C. for 40 minutes to produce a dry film on the substrate.

The dry film on the substrate was measured with the light having a wave length of 400~700 nm to determine the variation of transmittance of the film before and after the heat treatment of 250° C. for 60 minutes. The heat resistance is evaluated according to the following criteria:

○: Variation of transmittance is less than 5%
Δ: Variation of transmittance is between 5% and 10%
x: Variation of transmittance is larger than 10%

3. Chemical Resistance

The dry film on the substrates was measured with the light having a wave length of 400~700 nm to determine the variation of transmittance of the film before and after immersed in 2 wt % of NaOH solution for 10 minutes. The chemical resistance was evaluated according to the following criteria:

○: Variation of transmittance is less than 5%
Δ: Variation of transmittance is between 5% and 10%
x: Variation of transmittance is larger than 10%

4. Electric Resistance of the ITO Electrode Film (Unit: Ω)

On the surface of dry film, the ITO electrode film was formed with sputtering procedure, and the electric resistance of the ITO film was measured randomly at 3 different positions with a detector manufactured from Mitsubishi Chemical Media, the series No was MCP-T600.

Then, the electric resistance of the ITO electrode film could be determined by calculating the average of the electric resistance of the above 3 positions.

5. Residue

The photosensitive resin composition was coated onto the surface of a glass substrate with a spin coater to form a 8 μm wet film, and pre-baked at 85° C. for 5 minutes. Thereafter, the substrate was exposed to 200 mJ/cm² of ultraviolet light (exposure machine was manufactured from Canon Company, the series No was PLA-501F) through a photo mask. The substrate was then immersed in a developer solution at 23° C. for 2 minutes, and it was washed with pure water and dried with air. Thereafter, it was post-baked at 200° C. for 40 minutes to produce a pattern on the substrate.

Residue was observed by using an optical microscope.

○: No residue
Δ: little residue
x: much residue

While the present invention is illustrated with the preferred embodiments aforementioned, scope of the invention is not thus limited and should be determined in accordance with the appended claims.

What is claimed is:

1. A photosensitive resin composition for color filters comprising:
    (A) an alkali-soluble resin;
    (B) a photopolymerizable monomer;
    (C) a photoinitiator;
    (D) an organic solvent; and
    (E) a pigment;
    wherein said alkali-soluble resin (A) is formed by polymerizing at least one monomer (a-1) which dipole moment is below 1.5D and having at least one aromatic functional group and at least one copolymerizable monomer (a-2) other than said monomer (a-1), wherein the content of oligomer having a molecular weight below 1,000 of said alkali-soluble resin (A) is less than 0.6 wt %, based on the photosensitive resin composition except solvent(D).

2. The photosensitive resin composition for color filters of claim 1, wherein said monomers (a-1) is in an amount of 1–35 parts by weight during the polymerization of said alkali-soluble resin (A), based on 100 parts by weight of total said monomer (a-1) and (a-2).

* * * * *